US011387230B2

(12) United States Patent
Yu et al.

(10) Patent No.: US 11,387,230 B2
(45) Date of Patent: Jul. 12, 2022

(54) SYSTEM IN PACKAGE STRUCTURE FOR PERFORM ELECTROSTATIC DISCHARGE OPERATION AND ELECTROSTATIC DISCHARGE PROTECTION STRUCTURE THEREOF

(71) Applicant: Industrial Technology Research Institute, Hsinchu (TW)

(72) Inventors: Cheng-Hung Yu, Taoyuan (TW); Tai-Jui Wang, Kaohsiung (TW); Chieh-Wei Feng, Taoyuan (TW); Yu-Hua Chung, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/183,735

(22) Filed: Nov. 8, 2018

(65) Prior Publication Data

US 2019/0355713 A1 Nov. 21, 2019

(30) Foreign Application Priority Data

May 16, 2018 (TW) .................................. 107116632
Oct. 17, 2018 (CN) .......................... 201811208060.7

(51) Int. Cl.
*H01L 27/02* (2006.01)
*H02H 9/04* (2006.01)
(Continued)

(52) U.S. Cl.
CPC ...... *H01L 27/0248* (2013.01); *H01L 23/5383* (2013.01); *H01L 23/5384* (2013.01);
(Continued)

(58) Field of Classification Search
CPC ... H01L 27/0248; H01L 27/124; H01L 27/12; H01L 27/0292; H01L 23/5383;
(Continued)

(56) References Cited

U.S. PATENT DOCUMENTS

2003/0058027 A1* 3/2003 Kwon .................... H01L 27/027
327/401
2004/0164381 A1* 8/2004 Li .......................... H01L 29/861
257/656
(Continued)

FOREIGN PATENT DOCUMENTS

CN 104425422 3/2015
CN 103293795 2/2016
(Continued)

OTHER PUBLICATIONS

"Office Action of Taiwan Related Application No. 107136443", dated May 31, 2019, pp. 1-8.
(Continued)

*Primary Examiner* — Sheng-Bai Zhu
(74) *Attorney, Agent, or Firm* — JCIPRNET

(57) ABSTRACT

A system in package structure and an electrostatic discharge protection structure thereof are provided. The electrostatic discharge protection structure includes a redistribution layer and a first transistor array. The redistribution layer has a first electrode and a second electrode. The first transistor array is coupled to a pin end of at least one integrated circuit, the first electrode and the second electrode. The first transistor array has a plurality of transistors. A plurality of first transistors of the transistors are coupled in parallel, and a plurality of second transistors of the transistors are coupled in parallel. The first transistors and the second transistors are configured to be turned on for dissipating an electrostatic discharge current.

20 Claims, 12 Drawing Sheets

(51) Int. Cl.
*H01L 23/538* (2006.01)
*H01L 27/12* (2006.01)

(52) U.S. Cl.
CPC ......... *H01L 23/5386* (2013.01); *H02H 9/046* (2013.01); *H01L 27/12* (2013.01); *H01L 27/124* (2013.01)

(58) Field of Classification Search
CPC . H01L 23/5384; H01L 23/5386; H01L 23/60; H01L 25/0655; H02H 9/046
See application file for complete search history.

(56) References Cited

U.S. PATENT DOCUMENTS

| | | | |
|---|---|---|---|
| 2006/0033163 A1* | 2/2006 | Chen | H01L 29/861 257/355 |
| 2008/0003716 A1 | 1/2008 | Takahashi | |
| 2008/0136986 A1 | 6/2008 | Kim et al. | |
| 2012/0299661 A1* | 11/2012 | Williams | H03F 3/602 330/296 |
| 2013/0169355 A1* | 7/2013 | Chen | H01L 23/60 327/564 |
| 2014/0062585 A1* | 3/2014 | Weis | H03K 17/102 327/541 |
| 2015/0021595 A1* | 1/2015 | In | H01L 27/1225 257/43 |
| 2015/0333056 A1* | 11/2015 | Du | H01L 21/8221 257/773 |
| 2016/0095221 A1* | 3/2016 | Ramachandran | H05K 3/4038 361/783 |
| 2016/0373024 A1* | 12/2016 | Deboy | H02M 7/217 |
| 2017/0200716 A1* | 7/2017 | Or-Bach | H01L 27/092 |
| 2018/0323126 A1 | 11/2018 | Lin et al. | |

FOREIGN PATENT DOCUMENTS

| | | |
|---|---|---|
| CN | 106601733 | 4/2017 |
| TW | 267252 | 1/1996 |
| TW | I247411 | 1/2006 |
| TW | 200712710 | 4/2007 |
| TW | 201003884 | 1/2010 |
| TW | I351012 | 10/2011 |
| TW | I358872 | 2/2012 |
| TW | I413228 | 10/2013 |

OTHER PUBLICATIONS

"Office Action of China Counterpart Application", dated Mar. 24, 2021, p. 1-p. 6.

* cited by examiner

SYSTEM IN PACKAGE STRUCTURE FOR PERFORM ELECTROSTATIC DISCHARGE OPERATION AND ELECTROSTATIC DISCHARGE PROTECTION STRUCTURE THEREOF

CROSS-REFERENCE TO RELATED APPLICATION

This application claims the priority benefit of Taiwan application serial no. 107116632, filed on May 16, 2018 and China application serial no. 201811208060.7, filed on Oct. 17, 2018. The entirety of each of the above-mentioned patent applications is hereby incorporated by reference herein and made a part of this specification.

BACKGROUND

Technical Field

The disclosure relates to a system in package structure and an electrostatic discharge protection structure thereof.

Description of Related Art

As electronic technology advances, electronic devices nowadays usually execute a variety of different functions by disposing a plurality of integrated circuits. To reduce areas required for layout of integrated circuits, and to simplify wiring complexity between integrated circuits, a system in package (SiP) has become a popular option.

In the conventional system in package, a plurality of integrated circuits included in the system in package, during processing and manufacturing, may store a certain degree of electrostatic charge. While the integrated circuit is packed to the system in package, the electrostatic charge is dissipated to a redistribution layer (RDL), and may cause damage of the integrated circuit or circuit damage in the redistribution layer.

SUMMARY

The electrostatic discharge protection structure of an exemplary embodiment of the disclosure includes a redistribution layer and a first transistor array. The redistribution layer is coupled to at least one integrated circuit. The redistribution layer has a first electrode and a second electrode. The first transistor array is coupled to a pin end of the at least one integrated circuit, the first electrode, and the second electrode. The first transistor array has a plurality of transistors. A plurality of first transistors of the transistors are coupled in parallel. A plurality of second transistors of transistors are coupled in parallel. The first transistors and the second transistors are configured to be turned on for dissipating an electrostatic discharge current.

A system in package structure of an exemplary embodiment of the disclosure includes the at least one integrated circuit and the aforementioned electrostatic discharge protection structure. The electrostatic discharge protection structure is coupled to the pin end of the at least one integrated circuit, and is configured to dissipate the electrostatic discharge current occurred on the pin end.

To make the aforementioned more comprehensible, several exemplary embodiments accompanied with drawings are described in detail as follows.

DESCRIPTION OF THE EXEMPLARY EMBODIMENTS

Figure 1:
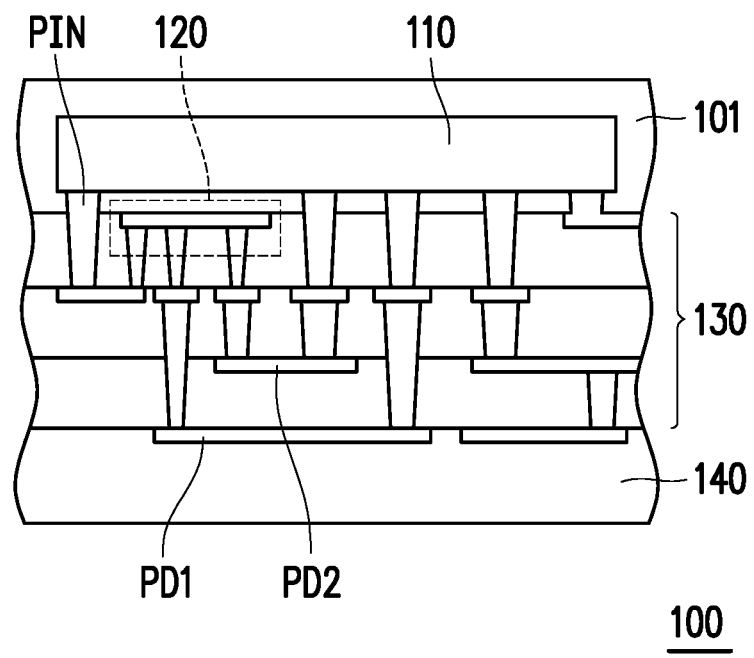
FIG. 1 illustrates a cross-sectional schematic diagram of a system in package structure of an exemplary embodiment of the disclosure.

Please refer to FIG. 1. FIG. 1 illustrates a cross-sectional schematic diagram of a system in package structure of an exemplary embodiment of the disclosure. A system in package structure 100 includes an integrated circuit 110 and an electrostatic discharge protection structure coupled to the integrated circuit 110. The electrostatic discharge protection structure includes a redistribution layer 130 and a transistor array 120. The redistribution layer 130, for example, includes multilayer dielectric layers and multilayer conductive layers alternately stacked. The redistribution layer 130 is coupled to the integrated circuit 110, and redistributes the integrated circuit 110. In an exemplary embodiment, the redistribution layer 130 has a first electrode PD1 and a second electrode PD2, wherein the first electrode PD1 and the second electrode PD2 are coupled to the transistor array 120.

In addition, in an exemplary embodiment, the integrated circuit 110 is disposed in an encapsulating material 101, and the redistribution layer 130 is disposed between the encapsulating material 101 and a substrate 140.

The substrate 140 in this embodiment may include an organic polymer material, an inorganic polymer material, or an organic-inorganic hybrid material. The organic polymer material may be polyimide (PI), polybenzoxazole (PBO), benzocyclobutene polymer (BCB) or other suitable materials. The inorganic polymer material may be silicon oxide, silicon nitride, silicon oxynitride, polysiloxane, polysilazane, polysiloxazane, polycarbosilane or other suitable materials. In other embodiments, it may also be substrates of glass substrates, printed circuit boards, semiconductor integrated circuit carriers, or semiconductor chips.

The transistor array 120 is also coupled to a pin end PIN of the integrated circuit 110, wherein, in this exemplary embodiment, the transistor array 120 is coupled to the pin end PIN of the integrated circuit 110 by a wire of the redistribution layer 130. The transistor array 120 includes a plurality of first transistors and a plurality of second transistors, wherein a plurality of the first transistors are coupled in parallel between the pin end PIN and the first electrode PD1, and a plurality of second transistors are coupled in parallel between the pin end PIN and the second electrode PD2. When an electrostatic discharge phenomenon occurs on the pin end PIN of the integrated circuit 110, the first transistors or the second transistors may be correspondingly turned on, and are configured to dissipate an electrostatic discharge current.

In an exemplary embodiment of the disclosure, the transistor array 120 may be disposed in the redistribution layer 130. Moreover, a vertical projection plane of the transistor array 120 against the redistribution layer 130 totally overlaps with a vertical projection plane of the integrated circuit 110 against the redistribution layer 130 (as shown in FIG. 1). However, the disclosure is not limited thereto. In other embodiments, the vertical projection plane of the transistor array 120 against the redistribution layer 130 partially overlaps or does not overlap with a vertical projection plane of the integrated circuit 110 against the redistribution layer 130.

The transistor array 120 in the embodiment is formed in the redistribution layer 130 outside the integrated circuit 110, not disposed in the integrated circuit 110 or in the interposer of the substrate 140. In this way, the transistor array 120 may perform a highly efficient electrostatic discharge operation without occupying the layout area of the integrated circuit 110.

Figure 2:
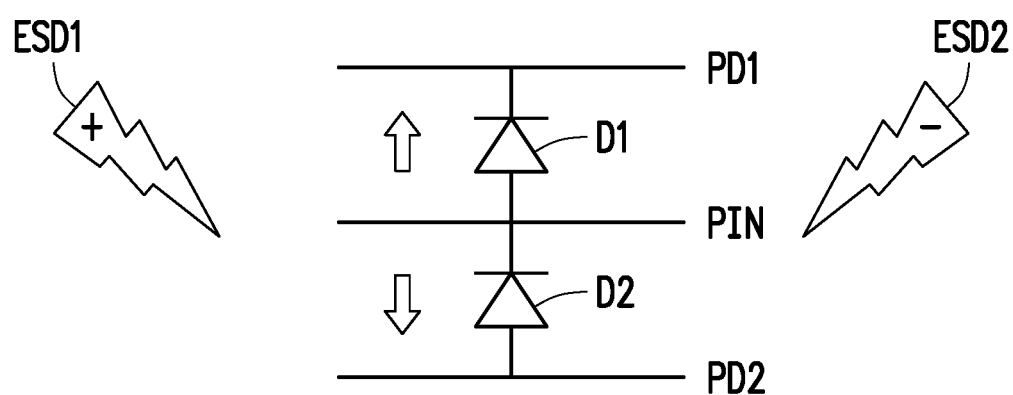
FIG. 2 illustrates an equivalent circuit diagram of a transistor array of an exemplary embodiment of the disclosure.

Please refer FIG. 1 and FIG. 2 at the same time, wherein FIG. 2 illustrates an equivalent circuit diagram of a transistor array of an exemplary embodiment of the disclosure. In FIG. 2, each of the transistors of the plurality of the first transistors is coupled into a diode configuration. For example, a gate and a source of each of the transistors are coupled together (if the first transistors are thin film transistors). The plurality of the first transistors are coupled in parallel, equivalent to a diode D1. Each of the transistors of a plurality of second transistors is coupled into a diode configuration. For example, the gate and the source of each of the transistors are coupled together (if the first transistors are thin film transistors). The plurality of second transistors are coupled in parallel, equivalent to a diode D2, wherein a cathode of the diode D1 is coupled to the first electrode PD1, an anode of the diode D1 is coupled to the pin end PIN, and is coupled to a cathode of the diode D2. In addition, an anode of the diode D2 is coupled to the second electrode PD2.

When a positive electrostatic discharge phenomenon ESD1 occurs on the pin end PIN of the integrated circuit 110, the diode D1 may be correspondingly turned on, a current dissipation path between the pin end PIN and the first electrode PD1 is formed, and the electrostatic discharge current generated from the electrostatic discharge phenomenon ESD1 is effectively dissipated. In contrast, when a negative electrostatic discharge phenomenon ESD2 occurs on the pin end PIN of the integrated circuit 110, the diode D2 may be correspondingly turned on, the current dissipation path between the pin end PIN and the second electrode PD2 is formed, and the electrostatic discharge current generated from the electrostatic discharge phenomenon ESD2 is effectively dissipated.

In an exemplary embodiment of the disclosure, the diodes D1 and D2 are composed of the plurality of the first transistors and the plurality of the second transistors, respectively. In addition, each of the transistors (each of the first transistors or each of the second transistors) has a relatively small size. For example, a channel length of each of the transistors may be substantially disposed between 3 to 10 micrometers, and a channel width of each of the transistors may be substantially disposed between 3 to 10 micrometers. The aforementioned channel length and the channel width include slight errors generated while manufacturing. Furthermore, the first transistors and the second transistors of this embodiment may be thin film transistors. As such, when the electrostatic discharge phenomenon ESD 1 or ESD 2 occurs, each of the small-sized first transistors or the second transistors may be quickly turned on, and the current dissipation path is effectively formed, to effectively dissipate the electrostatic discharge current.

In addition, regarding the number of the transistors disposed in the transistor array 120, it may be determined according to an electron mobility of the transistors, wherein the number of the transistors disposed in the transistor array 120 is negatively correlated to the electron mobility of the transistors disposed in the transistor array 120. That is, if the electron mobility of the transistors is smaller, a relatively large number of the transistors are required to be disposed in the transistor array 120. In contrast, if the electron mobility of the transistors is larger, a relatively small number of the transistors are required to be disposed in the transistor array 120. In consideration of both a layout area and an electrostatic discharge capability, in an embodiment, in the transistor array 120, the number of the first transistors may be disposed between 20 to 1000. In another embodiment, in the transistor array 120, the number of the first transistors may be disposed between 20 to 800. In yet another embodiment, in the transistor array 120, the number of the first transistors may be disposed between 20 to 300. The number of the second transistors may be disposed the same quantity as that of the first transistors. However, the disclosure is not limited thereto. Alternatively, under the condition that the requirement of the electrostatic discharge is less strict, 2 of the first transistors of an exemplary embodiment of the disclosure may be disposed.

Figure 3:
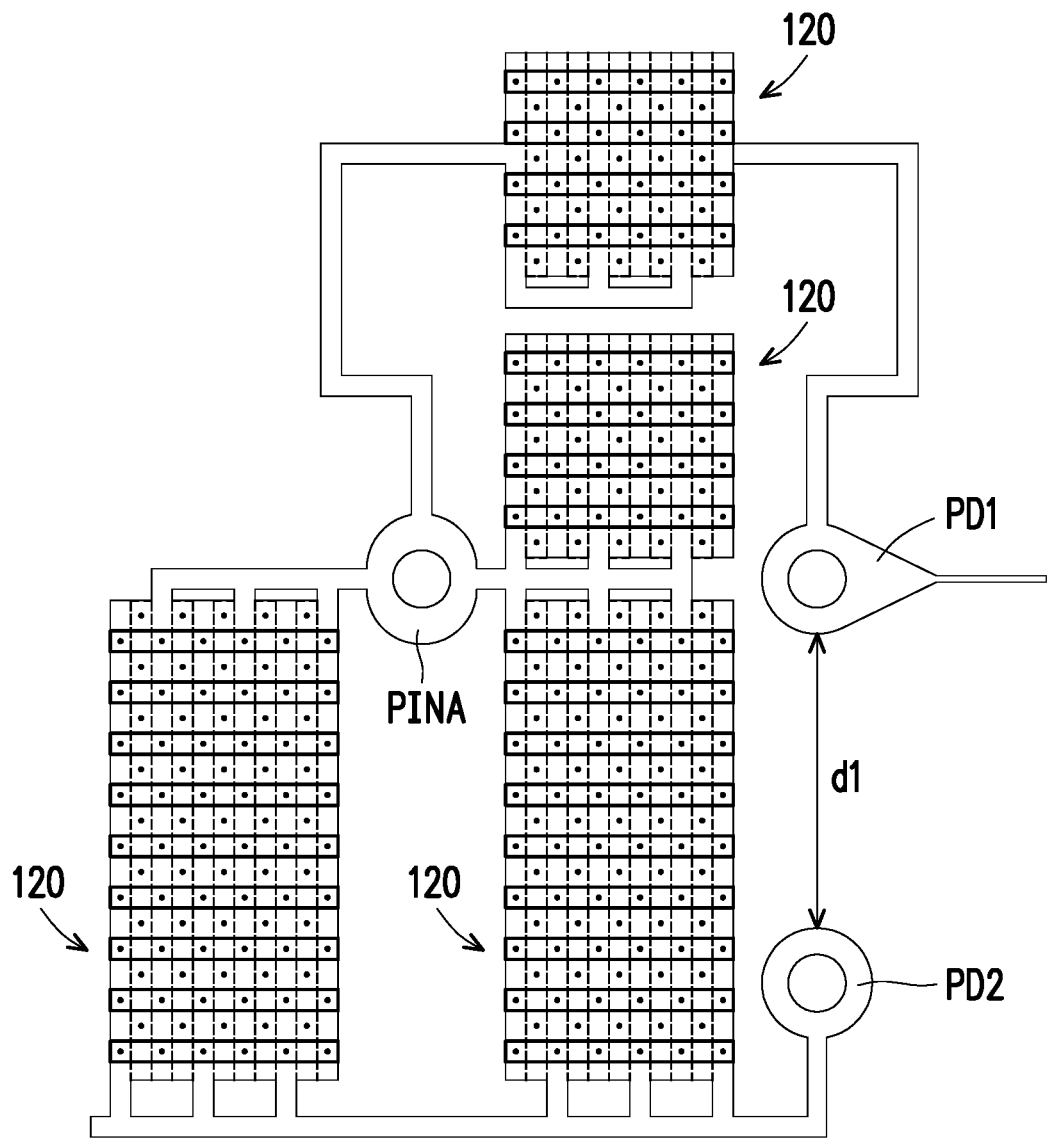
FIG. 3 illustrates a schematic top view of an electrostatic discharge protection structure of an exemplary embodiment of the disclosure.

Then, please refer to FIG. 3. FIG. 3 illustrates a schematic top view of an electrostatic discharge protection structure of an exemplary embodiment of the disclosure. An electrostatic discharge protection structure 300 includes the transistor array 120 and the redistribution layer, wherein the redistribution layer provides a first electrode PD1, a second electrode PD2 and a connecting wire PINA connected to the pin end of the integrated circuit. The transistor array 120 is coupled to the connecting wire PINA, and is connected to the pin end of the integrated circuit by the connecting wire PINA. The first electrode PD1 and the second electrode PD2 of FIG. 3 are adjacent to the transistor array 120, and are configured on one side of the transistor array 120, wherein, in an exemplary embodiment, a distance d1 between the first electrode PD1 and the second electrode PD2 is larger or equal to 100 micrometers.

The first electrode PD1 and the second electrode PD2 in FIG. 3 are connected to the transistor array 120 by the connecting wire of other location (or layer) in the redistribution layer.

Figure 4A:
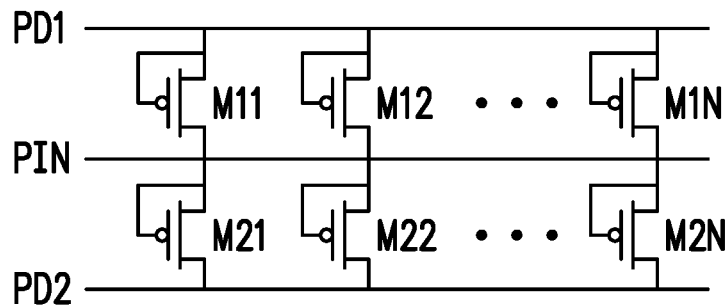
FIGS. 4A to 4D illustrate schematic diagrams of different examples of a transistor array of an exemplary embodiment of the disclosure.

Regarding implementing details of the transistor array of an exemplary embodiment of the disclosure, please refer to schematic diagrams of different examples of a transistor array of an exemplary embodiment of the disclosure illustrated in FIG. 4A to FIG. 4D. In FIG. 4A, a transistor array 410 includes a plurality of first transistors M11-M1N and a plurality of second transistors M21-M2N. Each of the first transistors M11-M1N is coupled into a diode configuration. Each of the first transistors M11-M1N is coupled in parallel, and is coupled between the first electrode PD1 and the pin end PIN. Each of the second transistors M21-M2N is coupled into a diode configuration. Each of the second transistors M21-M2N is coupled in parallel, and is coupled to between the pin end PIN and the second electrode PD2.

In FIG. 4A, the first transistors M11-M1N and the second transistors M21-M2N are both P-type transistors, wherein each of a gate end and a first end of the first transistors M11-M1N are commonly coupled to the first electrode PD1, and each of a second end of the first transistors M11-M1N is commonly coupled to the pin end PIN. Each of the gate end and the first end of the second transistors M21-M2N is commonly coupled to the pin end PIN. Each of the second end of the second transistors M21-M2N is commonly coupled to the second electrode PD2, wherein the first electrode PD1 may be a power electrode, and the second electrode PD2 may be a ground electrode.

Figure 4B:
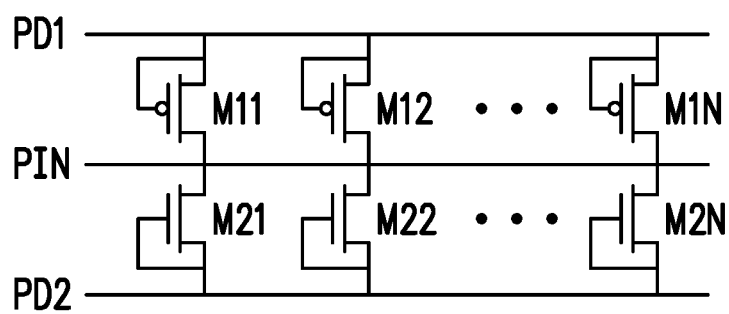

In FIG. 4B, different from FIG. 4A, the second transistors M21-M2N in a transistor array 420 are N-type transistors. In addition, each of the first end of the second transistors M21-M2N is coupled to the pin end PIN, and each of the second end and the gate end of the second transistors M21-M2N are commonly coupled to the second electrode PD2.

Figure 4C:
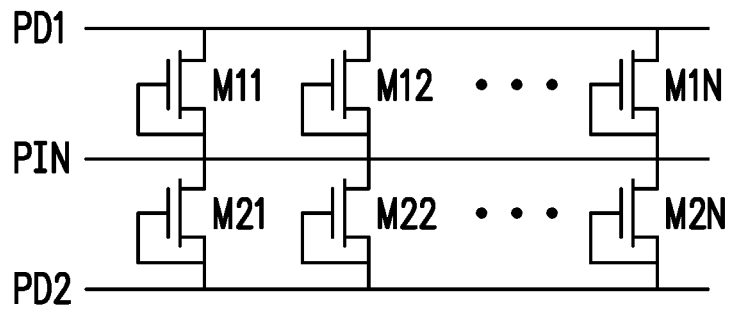

On the other hand, in FIG. 4C, different from FIG. 4B, the first transistors M11-M1N of the transistor array 430 are also N-type transistors. Furthermore, each of the first end of the first transistors M11-M1N is coupled to the first electrode PD1, and each of the second end and the gate end of the second transistors M21-M2N are commonly coupled to the pin end PIN.

Figure 4D:
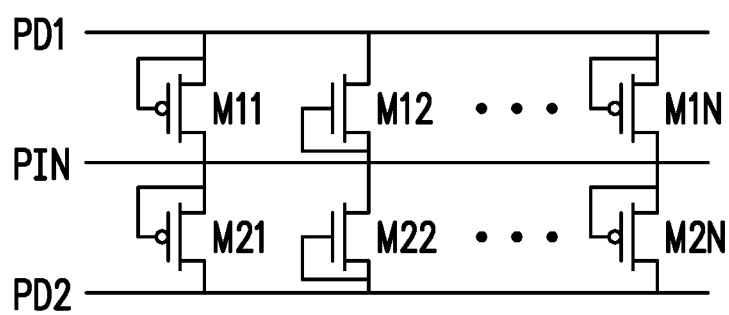

In FIG. 4D, the first transistors M11-M1N in a transistor array 440 include one or a plurality of N-type transistors (for example, the first transistor M12) and one or a plurality of P-type transistors (for example, the first transistors M11, M1N), and are arranged in a staggered configuration. The second transistors M21-M2N of the transistor array 440 also include one or a plurality of N-type transistors (for example, the second transistor M22) and one or a plurality of P-type transistors (for example, the second transistors M21, M2N), and are arranged in a staggered configuration. Each of the transistors M11-M2N is coupled into a diode configuration, wherein the anodes of the diodes consisting of the first transistors M11-M1N are coupled to the pin end PIN, and the cathodes of the diode are coupled to the first electrode PD1. The anodes of the diodes consisting of the second transistors M21-M2N are coupled to the second electrode PD2, and the cathodes of the diodes are coupled to the pin end PIN.

It can be acquired from the descriptions of FIG. 4D that in the embodiments of FIG. 4A to FIG. 4C of the disclosure, the first transistors M11-M1N or the second transistors M21-M2N may also be disposed by one or a plurality of P-type transistors and one or a plurality of N-type transistors, and it is unnecessary to choose the same conductive type of transistors.

Figure 5:
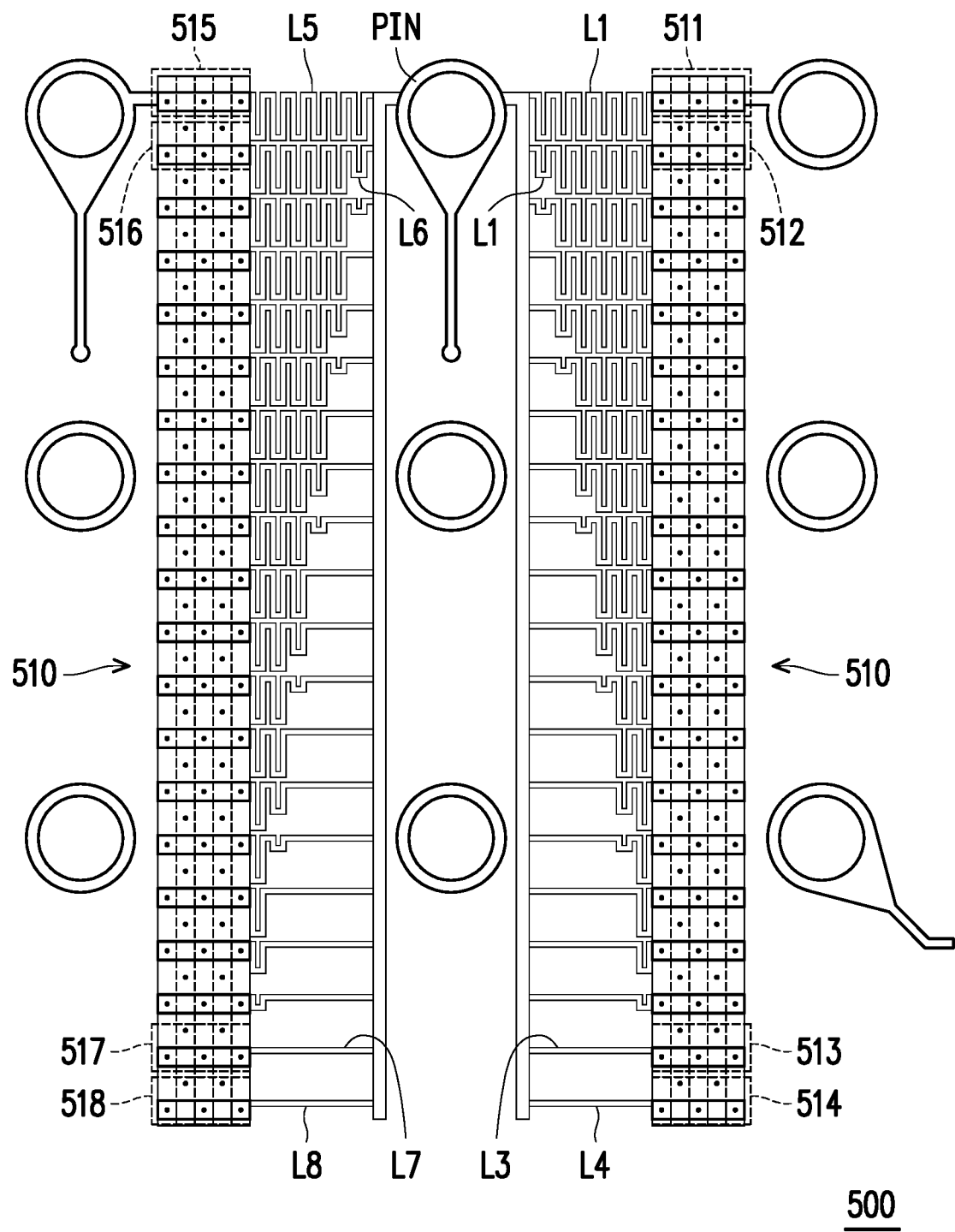
FIG. 5 illustrates a schematic diagram of another example of an electrostatic discharge protection structure of an exemplary embodiment of the disclosure.

Please refer to FIG. 5. FIG. 5 illustrates a schematic diagram of another example of an electrostatic discharge protection structure of an exemplary embodiment of the disclosure. In an electrostatic discharge protection structure 500, a transistor array 510 may at least include a plurality of transistor strings 511-518. Each of the transistor strings 511-518 may respectively include a plurality of the transistors. In addition, each of the transistor strings 511-518 is respectively coupled to the pin end PIN by a plurality of wires L1-L8. To improve the speed consistency of the transistors of the transistor array 510 being turned on, a transmission delay provided by the plurality of the wires L1-L8 between the transistor strings 511-518 and the pin end PIN is substantially the same. Although the above takes the transistor strings 511-518 as an example, the number of the transistor strings included in the transistor array 510 is not limited thereto. As shown in FIG. 5, the number of the transistor strings included in the transistor array 510 is more than that of the transistor strings 511-518, which is 8. Moreover, the transmission delay provided by each of the wires between the transistor strings and the pin end PIN is substantially the same.

Take the transistor strings 511 and 514 as examples. To make the transmission delay between the pin end PIN and the transistor strings 511 and 514 substantially the same, more bending portions may be generated on the wire L1 to enhance the transmission delay between the pin end PIN and the transistor string 511, and few bending on the wire L4 may be applied to reduce the transmission delay between the pin end PIN and the transistor string 514. As such, the transmission delay between the pin end PIN and the transistor strings 511 and 514 is substantially the same. In addition, when an electrostatic discharge phenomenon occurs, the pin end PIN and the transistor strings 511 and 514 may be turned on at the same time, and the dissipation speed of the electrostatic discharge current is enhanced. The wires L1-L8 may include different width and length of wires.

In continuation of the aforementioned example, the wires L1 and L4 may be designed to have the same width, length, and thickness, such that the wires L1 and L4 may have the same transmission delay. Alternatively, the wires L1 and L4 may be designed to have different width, thickness, and/or length, such that the wires have equivalent resistance, and the same transmission delay is generated. Furthermore, the layout method regarding the wires L1-L8 of FIG. 5 is solely one illustrative example, and is not set to limit the implementation of this disclosure. Layout methods for the wires having the same transmission delay shall be applied to this disclosure, and there is no specific limitation thereto.

Figure 6A:
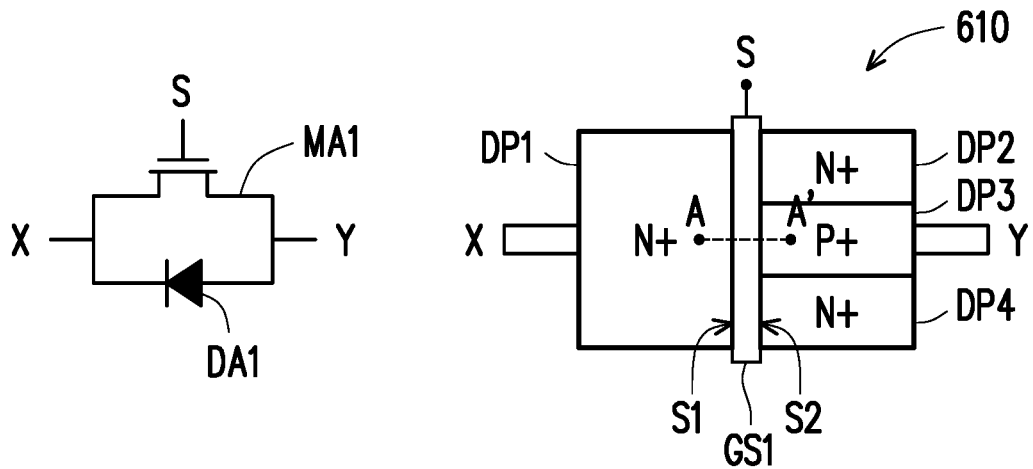
FIG. 6A and FIG. 6B illustrate schematic diagrams of examples of a transistor array of an exemplary embodiment of the disclosure.
Figure 6B:
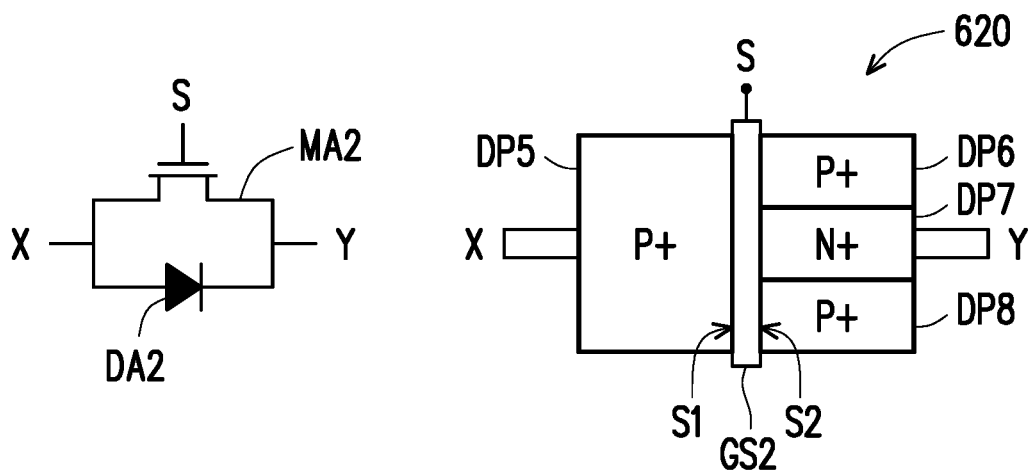

Please refer to FIG. 6A and FIG. 6B. FIG. 6A and FIG. 6B illustrate schematic diagrams of examples of a transistor array of an exemplary embodiment of the disclosure. In FIG. 6A and FIG. 6B, the corresponding diode of the transistor may also be configured in the transistor array. Take one single transistor in the transistor array as an example. In FIG. 6A, a transistor MA1 and a diode DA1 are coupled in parallel. For further illustrations, the transistor MA1 is an N-type transistor. A first end of the transistor MA1 is coupled to a cathode of the diode DA1, and an end point X is formed. A second end of the transistor MA1 is coupled to an anode of the diode DA1, and an end point Y is formed. The gate of the transistor MA1 is coupled to an end point S.

In terms of structure, the transistor MA1 and the diode DA1 may be disposed by an integrated structure 610. Please refer to FIG. 6A. FIG. 6A is a top view of the integrated structure 610. The integrated structure 610 includes a gate structure GS1 and doped areas DP1-DP4. The gate structure GS1 is connected to the end point S, overlaps with an insulating layer (not illustrated) and a semiconductor material (not illustrated), and covers the insulating layer and the semiconductor material. Both sides of the semiconductor material S1 and S2 respectively make contact with the doped areas DP1 and DP2-DP4, wherein the first side Si is opposite to the second side S2. The doped area DP1 is connected to the end point X. The doped area DP3 is connected to the end point Y. In this embodiment, the doped areas DP1, DP2 and DP4 are all N+-type, and the doped area DP3 is P+-type. Furthermore, the semiconductor material may be N+-type, P+-type, or a neutral type (without doping).

In FIG. 6B, a transistor MA2 and a diode DA2 are coupled in parallel. For further illustrations, the transistor MA2 is a P-type transistor. A first end of the transistor MA2 is coupled to an anode of the diode DA2, and the end point X is formed. A second end of the transistor MA2 is coupled to a cathode of the diode DA2, and the end point Y is formed. A gate end of the transistor MA2 is coupled to the end point S.

In terms of structure, the transistor MA2 and the diode DA2 may be disposed by an integrated structure 620. Please refer to FIG. 6B. FIG. 6B is a top view of the integrated structure 620. The integrated structure 620 includes a gate structure GS2 and doped areas DP5-DP8. The gate structure GS2 is connected to the end point S, covers the insulating layer (not illustrated) and the semiconductor material (not illustrated). Both sides of the semiconductor material S1 and S2 respectively contact with the doped areas DP5 and DP6-DP8, wherein the first side S1 is opposite to the second side S2. The doped area DP5 is connected to the end point X. The doped area DP7 is connected to the end point Y. In this embodiment, the doped areas DP5, DP6 and DP8 are all P+-type. The doped area DP7 is N+-type. Furthermore, the semiconductor material may be N+-type, P+-type, or a neutral type (without doping).

Figure 6C:
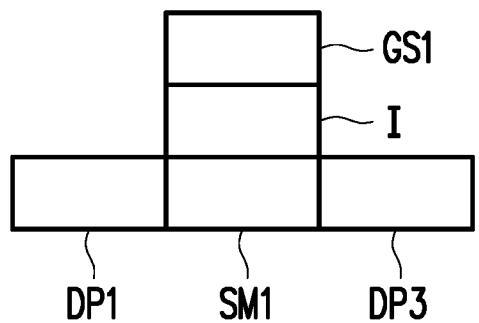
FIG. 6C and FIG. 6D are schematic diagrams of different examples of the cross-sectional structure illustrated according to the example of sectional line A-A' of FIG. 6A, respectively.
Figure 6D:
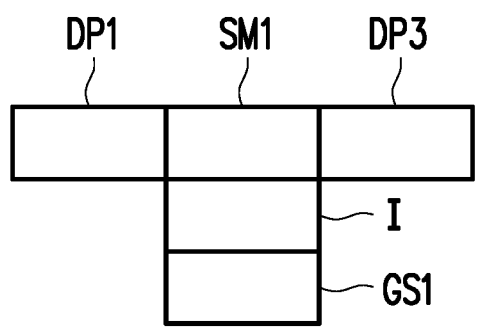

Please refer to FIG. 6C and FIG. 6D for the below. FIG. 6C and FIG. 6D are schematic diagrams of different examples of the cross-sectional structure illustrated according to the example of sectional line A-A' of FIG. 6A, respectively. In FIG. 6C, the doped areas DP1 and DP3 are respectively configured on opposite sides of a semiconductor material SM1. An insulating layer I, the semiconductor material SM1, and the gate structure GS1 are configured to overlap with each other, wherein the insulating layer I covers on the semiconductor material SM1. The insulating layer I may also completely cover, partially cover, or do not cover the doped area DP1 or DP3, and the gate structure GS1 covers over the insulating layer I. In addition, the configuration sequence of the semiconductor material SM1, the insulating layer I and the gate structure GS1 may be different. In FIG. 6D, the insulating layer I, the semiconductor material SM1, and the gate structure GS1 are configured to overlap with each other, wherein the semiconductor material SM1 covers over the insulating layer I, and the insulating layer I covers over the gate structure GS1.

Figure 7:
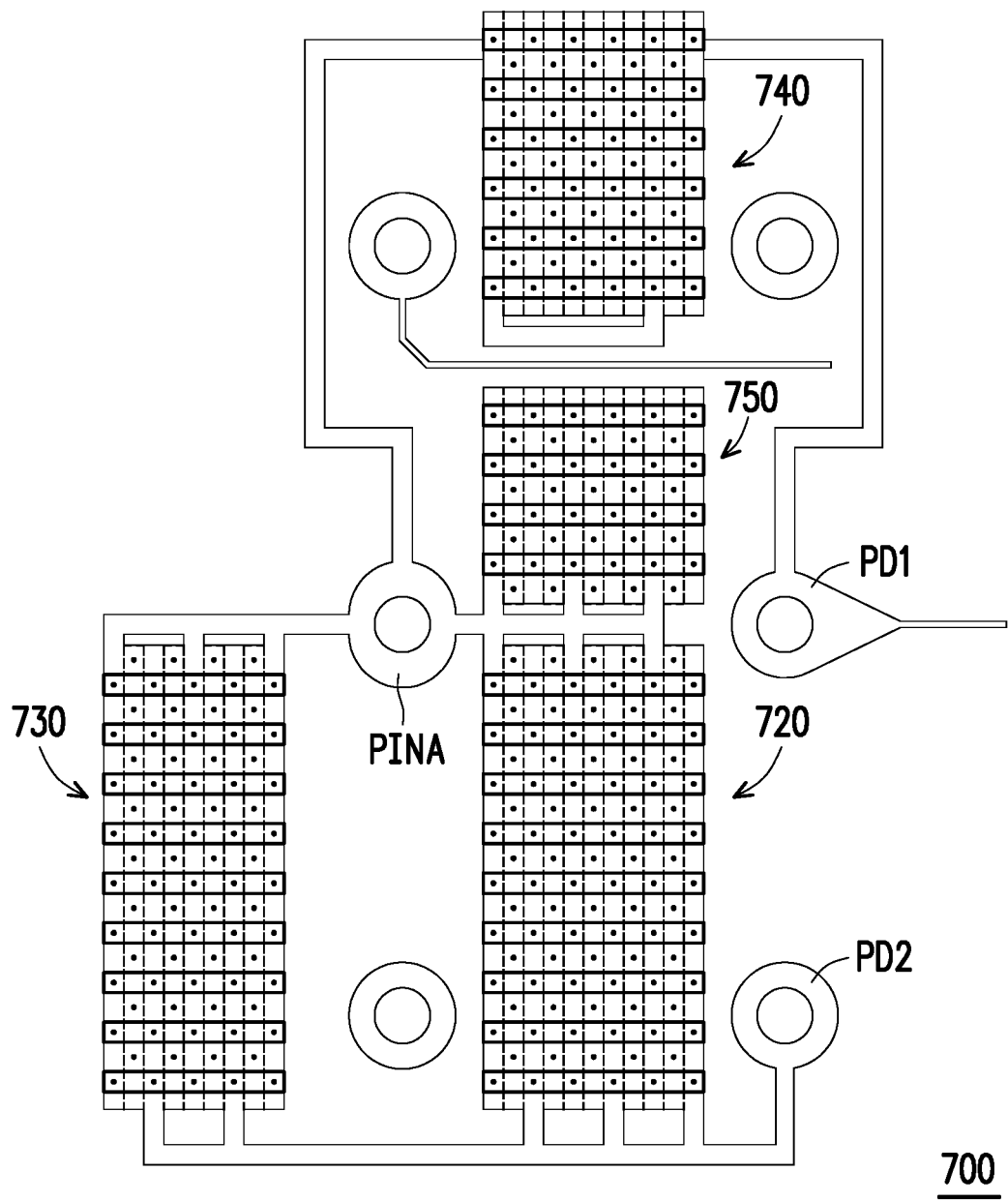
FIG. 7 illustrates a schematic top view of another example of an electrostatic discharge protection structure of the disclosure.

Please refer to FIG. 7. FIG. 7 illustrates a schematic top view of another example of an electrostatic discharge protection structure of the disclosure. An electrostatic discharge protection structure 700 includes a plurality of transistor arrays 720, 730, 740, 750 and the redistribution layer, wherein the redistribution layer provides the first electrode PD1, the second electrode PD2 and the connecting wire PINA connected to the pin end of the integrated circuit. The transistor arrays 720, 730 and 740 are coupled to the connecting wire PINA, and are connected to the pin end of the integrated circuit by the connecting wire PINA. In an exemplary embodiment, when the electrostatic discharge phenomenon occurs on the pin end of the integrated circuit, the dissipation capability of the electrostatic discharge current may be enhanced by a plurality of transistor arrays 720, 730, 740, and 750.

The number of the transistors in the transistor arrays 720, 730, 740 and 750 may be the same or may not be the same. In addition, the transistors in the transistor arrays 720, 730, and 740 may be formed by the manner as illustrated in FIG. 4A to FIG. 4C, or FIG. 6A, and FIG. 6B. However, there is no limit thereto. In addition, the dispose manner in each of the transistors of each of the transistor arrays 720, 730, 740, and 750 may be completely the same, partially the same, or totally different. However, the disclosure is not limited thereto.

Figure 8:
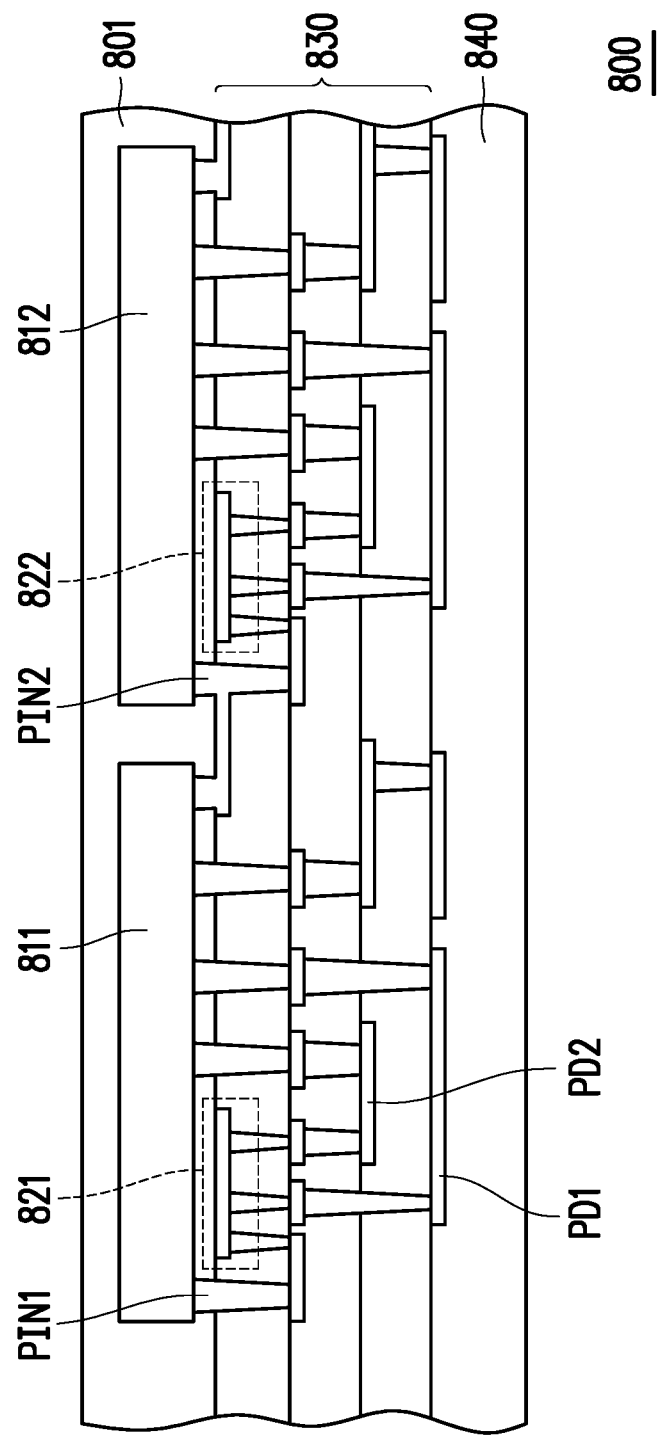
FIG. 8 illustrates a schematic view of a system in package structure of an exemplary embodiment of the disclosure.

Please refer to FIG. 8. FIG. 8 illustrates a cross-sectional structural schematic view of a system in package structure of an exemplary embodiment of the disclosure. A system in package structure 800 includes integrated circuits 811 and 812, a redistribution layer 830 and transistor arrays 821 and 822, wherein the redistribution layer 830 and the transistor arrays 821 and 822 are configured to form an electrostatic discharge protection structure. The integrated circuits 811, 812 are disposed in an encapsulating material 801. The redistribution layer 830 is configured between an encapsulating material 801 and a substrate 840. The transistor arrays 821 and 822 are disposed in the redistribution layer 830, and are coupled with the first electrode PD1 and the second electrode PD2 provided by the redistribution layer 830. In addition, the transistor arrays 821 and 822 are respectively coupled to the pin ends PIN1 and PIN2 of the integrated circuits 811 and 812. The transistor arrays 821 and 822 are configured to be turned on, and are respectively configured to dissipate the electrostatic discharge current occurred on the pin ends PIN1 and PIN2 of the integrated circuits 811 and 812.

It should be noted that, in the disclosure, the number of the integrated circuit included in the system in package structure 800 is not specifically limited. In addition, the number of the pin end corresponding to the integrated circuit, and the number of the configured transistor arrays are not specifically limited.

Regarding the implementing details of the electrostatic discharge protection structure of the exemplary embodiment, detailed statements are stated in the aforementioned embodiments and examples, and shall not be repeated.

Figure 9:
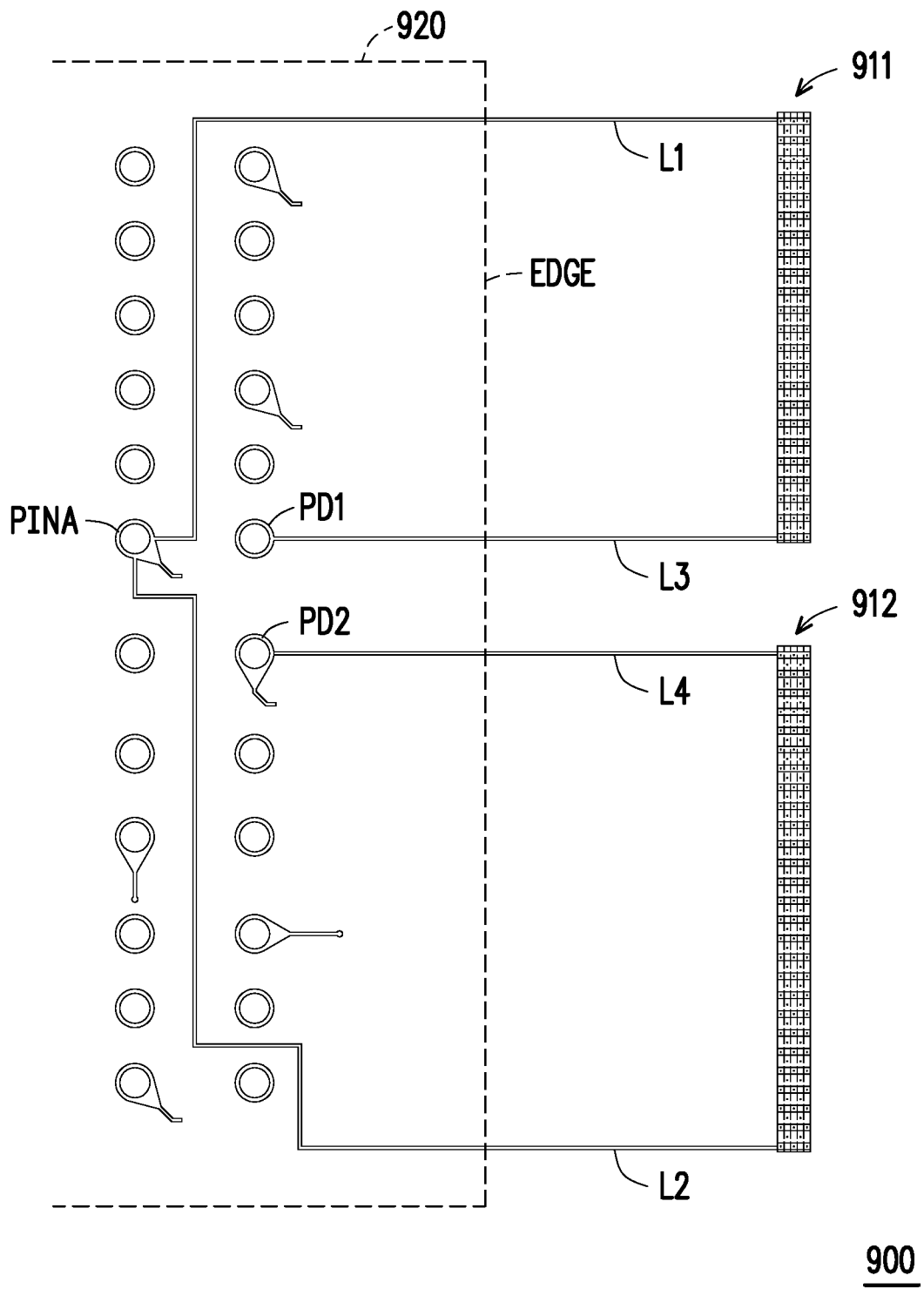
FIG. 9 illustrates a schematic top view of a system in package structure of an exemplary embodiment of the disclosure.

Please refer to FIG. 9. FIG. 9 illustrates a schematic top view of a system in package structure of an exemplary embodiment of the disclosure. In a system in package structure 900, an integrated circuit 920 has a pin end PINA. The pin end PINA is connected to transistor arrays 911 and 912 by the wires L1 and L2 formed by the redistribution layer. The redistribution layer provides wires L3 and L4, such that the first electrode PD1 and the second electrode PD2 are connected to the transistor arrays 911 and 912.

In this disclosure, the transistor arrays 911 and 912 are configured to the uncovered parts of the integrated circuit 920 (outside of an edge of the integrated circuit 920). In other embodiments of this disclosure, the transistor arrays 911 and 912 may be partially overlapped with the integrated circuit 920, or completely overlapped with the integrated circuit 920. However, the disclosure is not limited thereto.

Figure 10A:
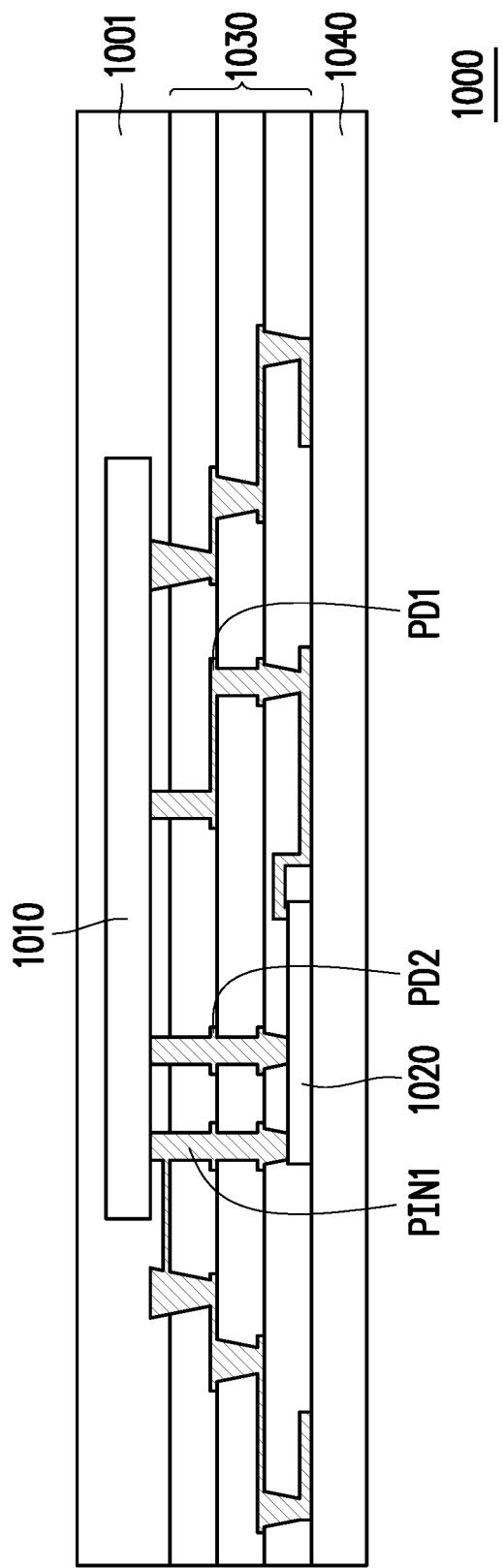
FIGS. 10A and 10B illustrate schematic cross-sectional views of a system package structure according to various embodiments of the disclosure.

Please refer to FIG. 10A. FIG. 10A is a cross-sectional structural diagram of a system package structure according to an embodiment of the disclosure. The system package structure 1100 includes an integrated circuit 1010 and an electrostatic discharge protection structure coupled to the integrated circuit 1010. The electrostatic discharge protection structure includes a redistribution layer 1030 and a transistor array 1020. The redistribution layer 1030 includes, for example, alternately stacked multilayer dielectric layers and multilayer conductive layers. The redistribution layer 1030 is coupled to the integrated circuit 1010 and performs redistribution operations on the integrated circuit 1010. In the embodiment, the redistribution layer 1030 has a first electrode PD1 and a second electrode PD2, herein the first electrode PD1 and the second electrode PD2 are coupled to the transistor array 1020. Also, in the embodiment, the integrated circuit 1010 is disposed in an encapsulation material 1001, and the redistribution layer 1030 is disposed between the encapsulation material 1001 and the substrate 1040. The transistor array 1020 in this embodiment is adjacent to the substrate 1040 for configuration. In other embodiments, the transistor array 1020 may be disposed at any location in the redistribution layer 1030 without particular limitations.

Please note that the transistor array 1020 in this embodiment is formed in the redistribution layer 1030 outside the integrated circuit 1010, not in the integrated circuit 1010 or in the interposer of the substrate 1040. As such, the transistor array 1020 can perform a highly efficient electrostatic discharge operation without taking up the layout area of the integrated circuit 1010.

Figure 10B:
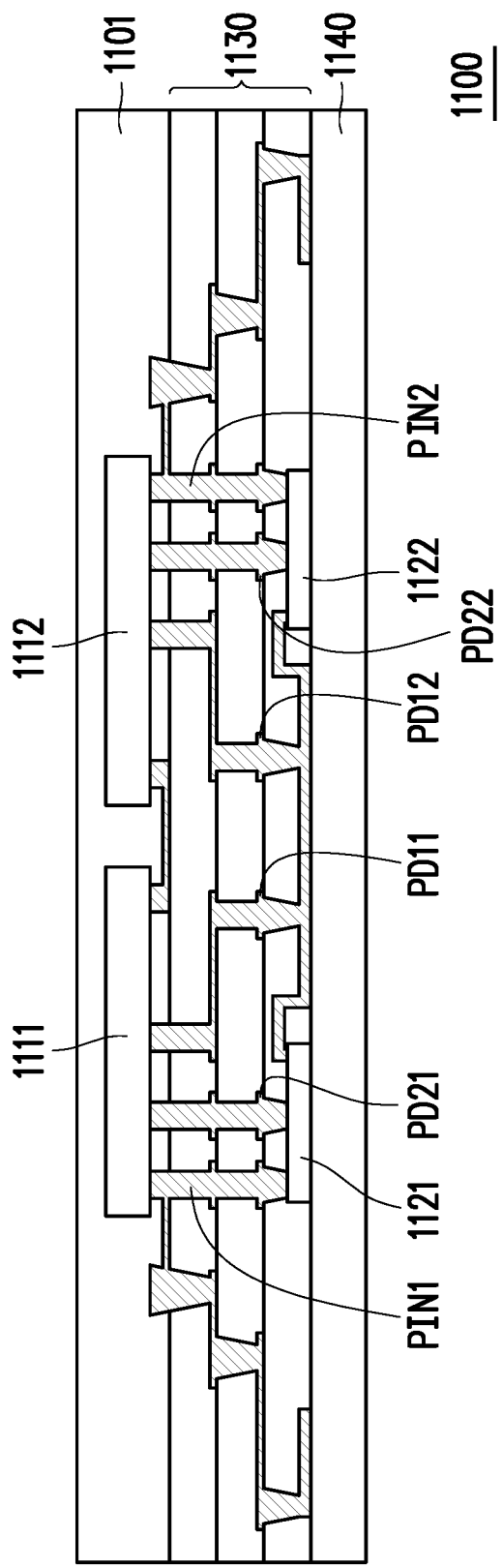

Please refer to FIG. 10B. FIG. 10B is a cross-sectional structural diagram of a system package structure according to an embodiment of the disclosure. The system package structure 1100 includes integrated circuits 1111, 1112, a redistribution layer 1130, and transistor arrays 1121 and 1122. The redistribution layer 1130 and the transistor arrays 1121 and 1122 are used to construct an electrostatic discharge protection structure. The integrated circuits 1111, 1112 are disposed in the encapsulation material 1101, and the redistribution layer 1130 is disposed between the encapsulation material 1101 and a substrate 1140. The transistor array 1121 is disposed in the redistribution layer 1130 and coupled to the first electrode PD11 and the second electrode PD21 provided by the redistribution layer 1130. The transistor array 1122 is disposed in the redistribution layer 1130 and coupled to the first electrode PD12 and the second electrode PD22 provided by the redistribution layer 1130. In addition, the transistor arrays 1121 and 1122 are coupled to the pin ends PIN1 and PIN2 of the integrated circuits 1111 and 1112, respectively. The transistor arrays 1121 and 1122 are used to be turned on and used to dissipate the electrostatic discharge currents generated on the pin ends PIN1 and the PIN 2 of the integrated circuits 1111 and 1112. Unlike the embodiment of FIG. 8, transistor arrays 1121, 1122 in the system package structure 1100 are disposed adjacent to substrate 1140. In other embodiments, the transistor arrays 1121, 1122 may be disposed at any location in the redistribution layer 1030 without particular limitations.

In view of the above, in the redistribution layer of this disclosure, a transistor array consisting of a plurality of transistors is provided. By coupling the transistor array and the pin end of the integrated circuit, the electrostatic discharge current of a charged-device model (CDM) occurred on the integrated circuit, can be dissipated through the current dissipation path formed when plurality of transistors coupled in parallel are quickly turned on in the transistor array, to effectively prevent the redistribution layer or the integrated circuit from being damaged by the electrostatic discharge current.

Based on the above, an exemplary embodiment of the disclosure provides a transistor array consisting a plurality of the transistors coupled in parallel, such that the transistor array is coupled to the pin end of the integrated circuit, and is coupled to the first electrode and the second electrode provided by the redistribution layer. When an electrostatic discharge phenomenon occurs, a plurality of the transistors in the transistor array may be quickly turned on, such that the electrostatic discharge current is quickly dissipated to the first electrode or the second electrode to effectively perform an electrostatic discharge protection, and protect the integrated circuit or the redistribution layer from being damaged.

Although the disclosure is disclosed as the exemplary embodiments above, the exemplary embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. An electrostatic discharge protection structure, coupled to at least one integrated circuit disposed in an encapsulating material, comprising:
a redistribution layer, disposed outside the encapsulating material, opposite to the at least one integrated circuit, having multilayer dielectric layers and multilayer conductive layers alternately stacked between the at least one integrated circuit and a substrate, and coupled to the at least one integrated circuit, the redistribution layer having a first electrode and a second electrode; and
a first transistor array, disposed outside the encapsulating material and the at least one integrated circuit and coupled to a pin end of the at least one integrated circuit, the first electrode and the second electrode, the first transistor array having a plurality of transistors, a plurality of first transistors of the transistors coupled in parallel, and a plurality of second transistors of the transistors coupled in parallel, the first transistors and the second transistors configured to be turned on for dissipating an electrostatic discharge current,
wherein the first transistor array, the first electrode and the second electrode are disposed in one of the multilayer conductive layers, respectively,
wherein the arrangement of the transistors is a plurality of transistor strings, the transistor strings are respectively coupled to the pin end by a plurality of wires, wherein the wires respectively provide a plurality of transmission delay, which are the same.

2. The electrostatic discharge protection structure according to claim 1, wherein the first transistors respectively correspond to the second transistors, each of a first end of the first transistors is coupled to the first electrode, each of a second end of the first transistors is coupled to the corresponding first end of the second transistors and the pin end, and each of the second end of the second transistors corresponding to each of the first transistors is coupled to the second electrode.

3. The electrostatic discharge protection structure according to claim 1, wherein each of the first transistors is a P-type transistor or an N-type transistor, and each of the second transistors is a P-type transistor or an N-type transistor.

4. The electrostatic discharge protection structure according to claim 1, wherein the transistors are coupled into a diode configuration.

5. The electrostatic discharge protection structure according to claim 1, wherein the number of the transistors is determined according to an electron mobility of the transistors.

6. The electrostatic discharge protection structure according to claim 5, wherein the number of the transistors is negatively correlated to the electron mobility.

7. The electrostatic discharge protection structure according to claim 5, wherein the number of the first transistors and the second transistors is between 20 to 1000.

8. The electrostatic discharge protection structure according to claim 1, wherein a channel width of each of the transistors is substantially between 3 to 10 micrometers, and a channel length of each of the transistors is substantially between 3 to 10 micrometers.

9. The electrostatic discharge protection structure according to claim wherein a vertical projection plane of the integrated circuit against the redistribution layer completely overlaps, partially overlaps, or does not overlap with a vertical projection plane of the first transistor array against the redistribution layer.

10. The electrostatic discharge protection structure according to claim 1, further comprising:
a plurality of diodes, the diodes respectively coupled to the transistors.

11. The electrostatic discharge protection structure according to claim 10, wherein each of the diodes and each of the corresponding transistors comprise:
a semiconductor material;
an insulating layer, configured to overlap with the semiconductor material;
a gate structure, configured to overlap with the insulating layer;
a first doped area, configured to a first side of the semiconductor material, and coupled to each of the first end of the transistors and each of the corresponding first end of the diodes;
a second doped area, a third doped area, and a fourth doped area, configured to a second side of the semiconductor material,
wherein the first side is opposite to the second side, the third doped area is coupled to each of the second end of the transistors and each of the second end of the diodes, doping types of the first doped area, the second doped area, and the fourth doped area are the same, and doping types of the first doped area and the third doped area are opposite.

12. The electrostatic discharge protection structure according to claim 11, wherein doping types of the first doped area, the second doped area, and the fourth are N-type, each of the corresponding transistors is an N-type transistor, each of the first end of the corresponding diodes is a cathode, each of the second end of the corresponding diodes is an anode.

13. The electrostatic discharge protection structure according to claim 11, wherein doping types of the first doped area, the second doped area, and the fourth doped area are P-type, each of the corresponding transistors is a P-type transistor, each of the first end of the corresponding transistors is an anode, and each of the second end of the corresponding transistors is a cathode.

14. The electrostatic discharge protection structure according to claim 1, wherein the transistors are thin film transistors.

15. The electrostatic discharge protection structure according to claim 1, further comprising:
at least one second transistor array, coupled to the at least one pin end of the integrated circuit, the first electrode and the second electrode, the second transistor array configured to be turned on for dissipating the electrostatic discharge current.

16. The electrostatic discharge protection structure according to claim 1, wherein the first electrode is a power electrode, the second electrode is a ground electrode.

17. A system in package structure, comprising:
at least one integrated circuit; and
an electrostatic discharge protection structure according to claim 1, coupled to the pin end of the at least one integrated circuit, and configured to dissipate an electrostatic discharge current occurred on the pin end.

18. The electrostatic discharge protection structure according to claim 1, wherein the wires have the same equivalent resistances or each of the wires has at least a bending portion.

19. An electrostatic discharge protection structure, coupled to at least one integrated circuit disposed in an encapsulating material, comprising:
a redistribution layer, disposed outside the encapsulating material, opposite to the at least one integrated circuit, having a plurality of layers between the at least one integrated circuit and a substrate, and coupled to the at least one integrated circuit, the redistribution layer having a first electrode and a second electrode; and
a first transistor array, disposed outside the encapsulating material and the at least one integrated circuit and coupled to a pin end of the at least one integrated circuit, the first electrode and the second electrode, the first transistor array having a plurality of transistors, a plurality of first transistors of the transistors coupled in parallel, and a plurality of second transistors of the transistors coupled in parallel, the first transistors and the second transistors configured to be turned on for dissipating an electrostatic discharge current,
wherein the first transistor array, the first electrode and the second electrode are disposed in one of the plurality of layers, respectively,
wherein the arrangement of the transistors is a plurality of transistor strings, the transistor strings are respectively coupled to the pin end by a plurality of wires, wherein the wires respectively provide a plurality of transmission delay, which are the same.

20. The electrostatic discharge protection structure according to claim 19, wherein the wires have the same equivalent resistances or each of the wires has at least a bending portion.

* * * * *